(12) United States Patent
Chatelain et al.

(10) Patent No.: US 11,822,456 B2
(45) Date of Patent: Nov. 21, 2023

(54) MODEL CONTROL PLATFORM

(71) Applicant: Accenture Global Solutions Limited, Dublin (IE)

(72) Inventors: Jean-Luc Chatelain, Atlanta, GA (US); Louis Gerald Farfan, Lomita, CA (US); Teresa Sheausan Tung, Tustin, CA (US); Fabio Bucci, Bologna (IT)

(73) Assignee: ACCENTURE GLOBAL SOLUTIONS LIMITED, Dublin (IE)

( * ) Notice: Subject to any disclaimer, the term of this patent is extended or adjusted under 35 U.S.C. 154(b) by 422 days.

(21) Appl. No.: 16/896,441

(22) Filed: Jun. 9, 2020

(65) Prior Publication Data
US 2021/0081709 A1 Mar. 18, 2021

Related U.S. Application Data

(60) Provisional application No. 62/900,454, filed on Sep. 13, 2019.

(51) Int. Cl.
*G06F 11/34* (2006.01)
*G06N 5/04* (2023.01)
(Continued)

(52) U.S. Cl.
CPC ........ *G06F 11/3447* (2013.01); *G06F 18/213* (2023.01); *G06F 18/285* (2023.01);
(Continued)

(58) Field of Classification Search
CPC ....... G06K 9/6227; G06K 9/6232; G06N 5/04
See application file for complete search history.

(56) References Cited

U.S. PATENT DOCUMENTS

| 8,463,888 B1 * | 6/2013 | Boyer | G06Q 50/04 235/375 |
| 2009/0228408 A1 * | 9/2009 | Kaushal | G06N 5/04 714/26 |

(Continued)

OTHER PUBLICATIONS

Examination Report No. 3 in Australia Application No. 2020223718, dated Oct. 11, 2021, 6 pages.

(Continued)

*Primary Examiner* — Qun Shen
(74) *Attorney, Agent, or Firm* — Crowell & Moring, LLP

(57) ABSTRACT

The present disclosure relates to a system and a method for model control platform stack. The method includes, at an input layer of a model control platform stack, receiving input data. At a governance layer of the model control platform stack, the method includes maintaining a probe and model inventories; selecting a model, a monitoring location point, and a probe; and deploying, based on the selections of the probe and the model, a container to an orchestration layer of the model control platform stack. At the orchestration layer of the model control platform stack, the method includes accessing the container; using the container to deploy the probe and the model; scheduling an execution of the model to determine inference associated with the input data; during the execution, extracting probe data, using the probe, from the monitoring location point; and adjusting, based on the probe data and the inference, the model.

17 Claims, 17 Drawing Sheets

(51) Int. Cl.
  *G06F 30/27*    (2020.01)
  *G06F 18/20*    (2023.01)
  *G06F 18/213*   (2023.01)
  *G05B 13/04*    (2006.01)

(52) U.S. Cl.
  CPC ............... *G06F 30/27* (2020.01); *G06N 5/04* (2013.01); *G05B 13/04* (2013.01)

(56) References Cited

U.S. PATENT DOCUMENTS

| | | | | |
|---|---|---|---|---|
| 2013/0079955 | A1* | 3/2013 | Masiello | G01J 5/025 |
| | | | | 702/182 |
| 2018/0060744 | A1* | 3/2018 | Achin | G06N 5/04 |
| 2018/0114140 | A1* | 4/2018 | Chen | G06N 5/022 |
| 2019/0036716 | A1 | 1/2019 | Kasaragod et al. | |
| 2019/0042297 | A1* | 2/2019 | Connor | H04L 43/20 |
| 2019/0279281 | A1* | 9/2019 | Kumar | G06Q 30/0631 |
| 2019/0392328 | A1* | 12/2019 | Gil Bulacio | H04L 63/16 |

OTHER PUBLICATIONS

Examination Report No. 4 in Australia Application No. 2020223718, dated Jan. 17, 2022, 7 pages.
Office Action in Australian Application No. 2020223718, dated Jan. 21, 2021, 8 pages.
Examination Report No. 2 in Australian Application No. 2020223718, dated Jun. 16, 2021, 4 pages.
Extended European Search regarding EP 20193191.2 dated Feb. 3, 2021, 12 pgs.
Liu, Tengfei et al., Architecture for ML marketplace integration in future networks including IMT-2020 (previous version posted as ML5G-I-146); Study Period 2017-2020; Focus Group ML5G, Series ML5G-I-167-R-2, International Telecommunication Union, Geneva, Aug. 21, 2019, pp. 1-44.

* cited by examiner receiving, by a model control platform circuitry comprising a memory storing instructions for a model control platform stack and a processor in communication with the memory, input data

510 the input data comes from a live deployment and is used to create an early warning system for the live deployment

MODEL CONTROL PLATFORM

RELATED APPLICATION

This application claims priority to U.S. Provisional Patent Application No. 62/900,454, filed on Sep. 13, 2019, which is incorporated by reference in its entirety.

TECHNICAL FIELD

This disclosure relates to a model control platform.

BACKGROUND

Rapid advances in electronics and communication technologies, driven by immense customer demand, have resulted in the widespread adoption of computer modeling systems. As one example, many petabytes of data are analyzed in statistical and machine learning models every year. Improvements in model tracking, training and/or management as described below and the attached will continue to increase the features and options available to teams using modeling systems.

SUMMARY

The present disclosure describes a method for a model control platform stack. The method includes, at an input layer of a model control platform stack, receiving, by a model control platform circuitry, input data. The model control platform circuitry includes a memory storing instructions for the model control platform stack and a processor in communication with the memory. At a governance layer of the model control platform stack, the method includes maintaining, by the model control platform circuitry, a probe inventory; maintaining, by the model control platform circuitry, a model inventory; selecting, by the model control platform circuitry based a type of the input data, a model from the model inventory; selecting, by the model control platform circuitry based on the model, a monitoring location point; selecting, by the model control platform circuitry based on the monitoring location point, a probe from the probe inventory; and deploying, by the model control platform circuitry based on the selections of the probe and the model, a container to an orchestration layer of the model control platform stack. At the orchestration layer of the model control platform stack, the method includes accessing, by the model control platform circuitry, the container; using, by the model control platform circuitry, the container to deploy the probe and the model; after deployment of the probe and the model, scheduling, by the model control platform circuitry, an execution of the model to determine inference associated with the input data; during the execution, extracting, by the model control platform circuitry and from the probe, probe data from the monitoring location point; and adjusting, by the model control platform circuitry based on the probe data and the inference, the model.

The present disclosure describes a system. The system includes a non-transitory memory storing instructions for a model control platform stack; and a processor in communication with the non-transitory memory. The processor executes the instructions to cause the system to, at an input layer of the model control platform stack, receive input data. At a governance layer of the model control platform stack, the processor executes the instructions to cause the system to: maintain a probe inventory; maintain a model inventory; select, based a type of the input data, a model from the model inventory; select, based on the model, a monitoring location point; select, based on the monitoring location point, a probe from the probe inventory; and deploy, based on the selections of the probe and the model, a container to an orchestration layer of the model control platform stack. At the orchestration layer of the model control platform stack, the processor executes the instructions to cause the system to: access the container; use the container to deploy the probe and the model; after deployment of the probe and the model, schedule an execution of the model to determine inference associated with the input data; during the execution, via the probe extract, probe data from the monitoring location point; and adjust, based on the probe data and the inference, the model.

In another example, the system includes machine-readable media other than a transitory signal; and instructions stored on the machine-readable media for a model control platform stack. At an input layer of the model control platform stack, when a processor executes the instructions, the system is configured to receive input data. At a governance layer of the model control platform stack, when a processor executes the instructions, the system is configured to: maintain a probe inventory; maintain a model inventory; select, based a type of the input data, a model from the model inventory; select, based on the model, a monitoring location point; select, based on the monitoring location point, a probe from the probe inventory; and deploy, based on the selections of the probe and the model, a container to an orchestration layer of the model control platform stack. At the orchestration layer of the model control platform stack, when a processor executes the instructions, the system is configured to: access the container; use the container to deploy the probe and the model; after deployment of the probe and the model, schedule an execution of the model to determine inference associated with the input data; during the execution, extract, using the probe, probe data from the monitoring location point; and adjust, based on the probe data and the inference, the model.

BRIEF DESCRIPTION OF THE DRAWINGS

FIG. 5 shows a flow diagram of an embodiment of a method using a model control platform stack.

DETAILED DESCRIPTION

Figure 1:
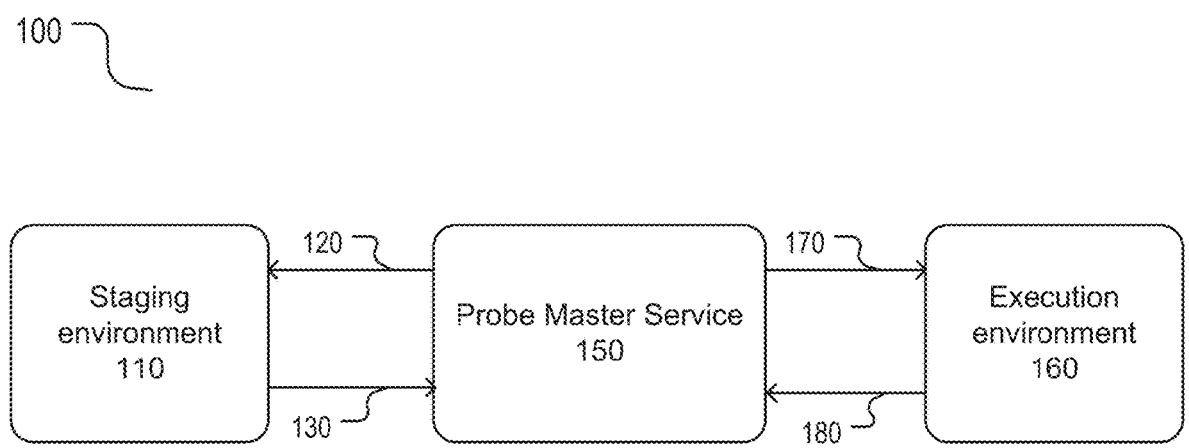
FIG. 1 shows a block diagram of an embodiment of a probe master service.

The disclosure will now be described in detail hereinafter with reference to the accompanied drawings, which form a part of the present disclosure, and which show, by way of illustration, specific examples of embodiments. Please note that the disclosure may, however, be embodied in a variety of different forms and, therefore, the covered or claimed subject matter is intended to be construed as not being limited to any of the embodiments to be set forth below. Please also note that the disclosure may be embodied as methods, devices, components, or systems. Accordingly, embodiments of the disclosure may, for example, take the form of hardware, software, firmware or any combination thereof.

Throughout the specification and claims, terms may have nuanced meanings suggested or implied in context beyond an explicitly stated meaning. Likewise, the phrase "in one embodiment" or "in one implementation" as used herein does not necessarily refer to the same embodiment or implementation and the phrase "in another embodiment" or "in another implementation" as used herein does not necessarily refer to a different embodiment or implementation. It is intended, for example, that claimed subject matter includes combinations of exemplary embodiments or implementations in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" or "at least one" as used herein, depending at least in part upon context, may be used to describe any feature, structure, or characteristic in a singular sense or may be used to describe combinations of features, structures or characteristics in a plural sense. Similarly, terms, such as "a", "an", or "the", again, may be understood to convey a singular usage or to convey a plural usage, depending at least in part upon context. In addition, the term "based on" or "determined by" may be understood as not necessarily intended to convey an exclusive set of factors and may, instead, allow for existence of additional factors not necessarily expressly described, again, depending at least in part on context.

The behavior of a dynamic system (such as a cooling system, fluid system, power delivery/generation system, or other dynamic system) may be monitored or predicted using one or more models. In some cases, the performance and output of the model(s) may be useful for the continued health and performance of the dynamic system. Accordingly, the model(s) may be monitored and trained to maintain accuracy and stability.

In various implementations, a model control platform stack may be provided as a testbed with probes facilitating monitoring of a model. Similar to an electronics testbed where exposed contacts on the circuit under test allow an operator to apply an electrical probe to the circuit and diagnose circuit performance at specific physical (and logical) locations within the circuit, the probes of the model control platform stack may allow monitoring of a model and/or the hardware/software execution environment of the model at specific physical and logical points. For example, physical data input locations, logical model input/interim/output stages, operating system software (e.g., executing at layers below the model and/or testbed itself), physical states of memory, or other monitoring points. For another example, probes may be model instrumentation points that generate data needed to evaluate model accuracy, or "performance", in near real time.

FIG. 1 describes a model control platform stack 100. The model control platform stack 100 may include all or a portion of the following: a probe master service 150, a staging environment 110, and an execution environment 160. In one implementation, the probe master service 150 may communicate with the staging environment 110 and/or the execution environment 160.

Referring to FIG. 1, the probe master service 150 may deploy a probe 120 to the staging environment 110, and receive a communication 130 from the staging environment. The staging environment 110 may be an environment to train, test, and/or monitor a staging model or a staging agent. In one implementation, the staging environment 110 may train, test, and/or monitor one staging model. In another implementation, the environment 110 may train, test, and/or monitor multiple staging models that are different from each other.

Based on the staging model, the probe 120 may be deployed to monitor one or more selected monitoring location points. When the staging model is executed in the staging environment, probe data from the one or more selected monitoring location points may be extracted. In one implementation, the probe 120 may be embedded in a container, and the container may be deployed by the probe master service 150 to the staging environment 110.

Referring to FIG. 1, the communication 130 from the staging environment 110 to the probe master service 150 may include all or a portion of the following: the probe data extracted by the probe from the one or more selected monitoring location points, one or more model instance key performance indicators (KPIs), one or more model events, one or more model alerts, one or more hyperparameter settings, a set of one or more training performance metrics, a set of one or more data distribution metrics, or a set of one or more operation system (OS) level metrics.

Referring to FIG. 1, the probe master service 150 may optionally deploy a probe 170 to the execution environment 160, and receive a communication 180 from the execution environment 160. The execution environment 160 may be a production environment to execute a production model and/or monitor a production agent. Based on the production model, the probe 170 may be deployed to monitor one or more selected monitoring location point. When the production model is executed in the production environment 160, probe data from the one or more selected monitoring location point may be extracted. The communication 180 from the execution environment 160 to the probe master service 150 may include all or a portion of the following: the probe data extracted by the probe from the one or more selected monitoring location points, one or more model events, or one or more execution performances.

The probe master service 150 may continuously monitor and evaluate the communication 130 received from the staging environment 110 and/or the communication 180 received from the execution environment 160. Based on the communication 130 received from the staging environment 110, the probe master service 150 may monitor and evaluate KPIs, adjust the staging model for improvement, and/or approve the staging model. Based on the communication 180 received from the execution environment 160, the probe master service 150 may monitor and evaluate KPIs, detect abnormal execution condition(s), and/or adjust the production model. In one implementation, an abnormality may include a difference between a predicted result and an actual result obtained by the probe (120 and/or 170). In one implementation, an inference may be obtained associated with an input data to the production model during an execution of the production model. For example, the inference may include a predicted result.

In one implementation, when an abnormality of the production model is detected, the model control platform stack 100 may generate and communicate a warning message, and the warning message may include the detected abnormality of the production model. For example, the warning message may be sent to an operator. After the operator receives the warning message, the operator may, depending on the abnormality in the warning message, command the model control platform stack 100 to deploy a staging model as a new production model to replace the production model in the execution environment 160.

In another implementation, the model control platform stack 100 may determine whether a severity of the detected abnormality of the production model is above a preset threshold. When the model control platform stack 100 determines the severity of the detected abnormality is above the preset threshold, the model control platform stack 100 may automatically deploy a staging model as a new production model to replace the production model in the execution environment 160.

When the model control platform stack 100 determines the severity of the detected abnormality is not above the preset threshold, the model control platform stack 100 may not deploy a staging model as a new production model to the execution environment 160. Instead, the model control platform stack 100 may generate and communicate a warning message to an operator, and the warning message may include the detected abnormality of the production model.

In another implementation, there may be a list of actions corresponding to a list of preset thresholds. Depending on the severity of the detected abnormality relative to the list of preset thresholds, the model control platform stack 100 may execute one of the list of actions.

Figure 2:
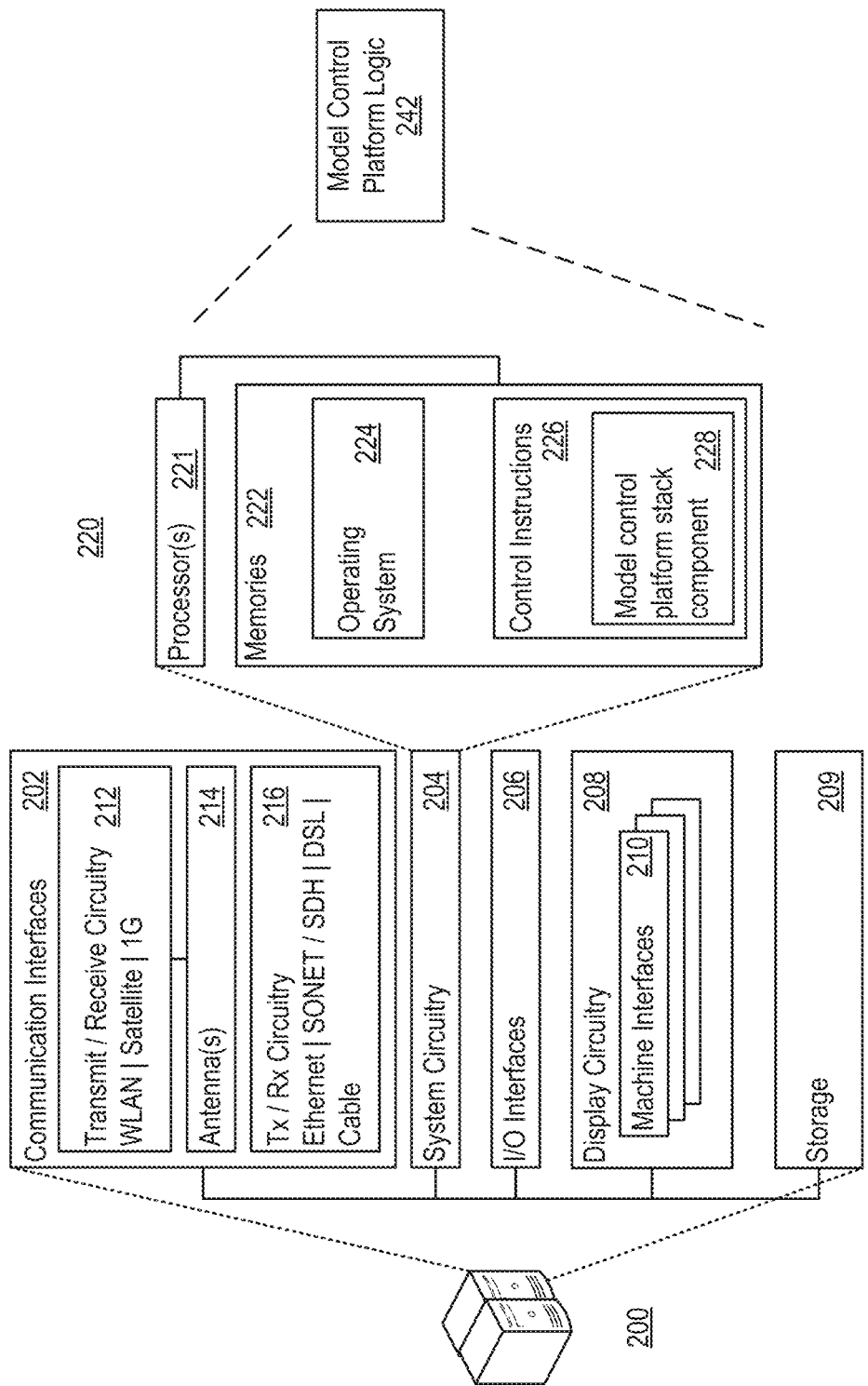
FIG. 2 shows computer systems that may be used to implement various components of the embodiment of FIG. 1.

FIG. 2 shows an example execution circuitry 200 for implementing the model control platform stack 100. The execution circuitry 200 may include a computer system 200 for implementing the model control platform stack 100, including the probe master service 150, the staging environment 110, and/or the execution environment 160.

Referring to FIG. 2, the execution circuitry 200 may include communication interfaces 202, system circuitry 204, input/output (I/O) interfaces 206, storage 209, and display circuitry 208 that generates machine interfaces 210 locally or for remote display, e.g., in a web browser running on a local or remote machine. The machine interfaces 210 and the I/O interfaces 206 may include GUIs, touch sensitive displays, voice or facial recognition inputs, buttons, switches, speakers and other user interface elements. Additional examples of the I/O interfaces 206 include microphones, video and still image cameras, headset and microphone input/output jacks, Universal Serial Bus (USB) connectors, memory card slots, and other types of inputs. The I/O interfaces 206 may further include magnetic or optical media interfaces (e.g., a CD ROM or DVD drive), serial and parallel bus interfaces, and keyboard and mouse interfaces. The display circuitry 208 may include man-machine interfaces and/or graphical user interfaces (GUI). The GUI may be used to present interfaces and/or options to facilitate model management and/or the execution of other tasks.

The communication interfaces 202 may include wireless transmitters and receivers ("transceivers") 212 and any antennas 214 used by the transmitting and receiving circuitry of the transceivers 212. The transceivers 212 and antennas 214 may support Wi-Fi network communications, for instance, under any version of IEEE 802.11, e.g., 802.11n or 802.11ac. The communication interfaces 202 may also include wireline transceivers 216. The wireline transceivers 116 may provide physical layer interfaces for any of a wide range of communication protocols, such as any type of Ethernet, data over cable service interface specification (DOCSIS), digital subscriber line (DSL), Synchronous Optical Network (SONET), or other protocol. Additionally or alternatively, the communication interface 202 may support secure information exchanges, such as secure socket layer (SSL) or public-key encryption-based protocols for sending and receiving private data.

The storage 209 may be used to store various initial, intermediate, or final data or model for implementing the model control platform stack 100. These data corpus may alternatively be stored in a database. In one implementation, the storage 209 of the computer system 200 may be integral with the database. The storage 209 may be centralized or distributed, and may be local or remote to the computer system 200. For example, the storage 209 may be hosted remotely by a cloud computing service provider.

The system circuitry 204 may include hardware, software, firmware, or other circuitry in any combination. The system circuitry 204 may be implemented, for example, with one or more systems on a chip (SoC), application specific integrated circuits (ASIC), microprocessors, discrete analog and digital circuits, and other circuitry.

The system circuitry 204 may support tasks described in the disclosure, including the drawings and/or claims. In one example, the system circuitry 204 may be implemented as processing circuitry 220 for implementing model control platform logic 242, which may provide software support to implement the various tasks performed by the model control platform stack 100 of FIG. 1. The processing circuitry 220 may include one or more processors 221 and one or more memories 222. The memories 222 stores, for example, control instructions 226 and an operating system 224. The control instructions 226, for example may include instructions for implementing the components 228 of the model control platform stack 100 of FIG. 1. In one implementation, the one or more processors 221 execute the control instructions 226 and the operating system 224 to carry out any desired functionality related to the model control platform stack.

Referring to FIG. 2, the memories 222 may further include applications and structures, for example, coded objects, templates, or one or more other data structures to facilitate model management and/or the execution of other tasks.

Figure 3:
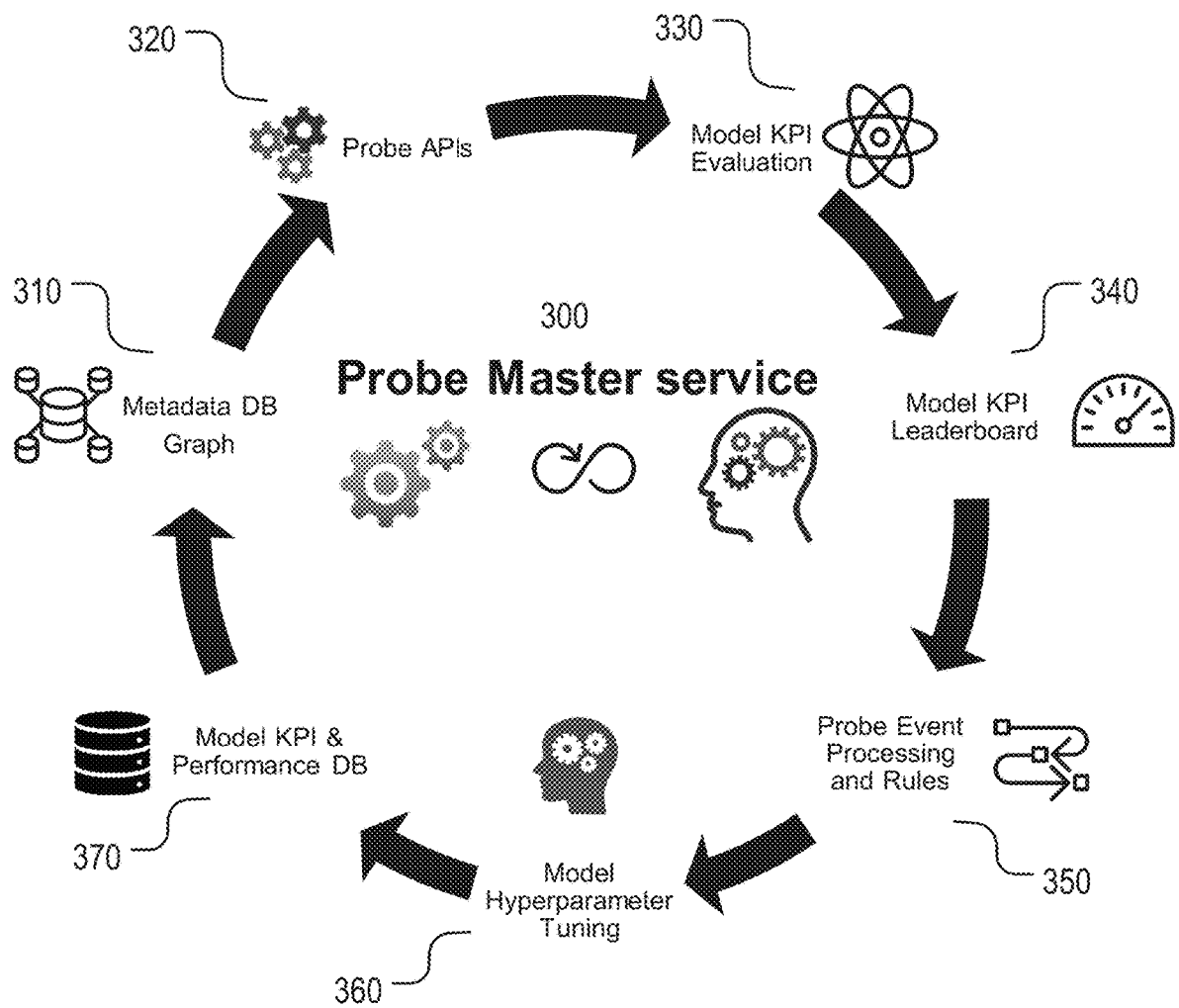
FIG. 3 shows a schematic diagram of an embodiment of a probe master service.

FIG. 3 describes a functional diagram for one embodiment of a probe master service 300. The probe master service 300 may include all or a portion of the following: one or more metadata database (DB) graphs 310, one or more probe application programming interfaces (API) 320, one or more model key performance indicator (KPI) evaluations 330, one or more model KPI leaderboards 340, one or more probe event processing and rules 350, one or more model hyperparameter tunings 360, one or more model KPI and performance DBs 370.

In one implementation, the probe master service 300 may include a metadata DB graph 310. One or more APIs may execute a model on the metadata DB graph 310 to probe the execution. One or more APIs may evaluate the model to obtain one or more KPIs of the model. One or more KPIs may include accuracy of the model, execution time of the model, or parameter space of the model. The probe master service 300 may include a model KPI leaderboard, which may list values of the KPIs for one or more models. Based on the model KPI leaderboard, the probe master service 300 may obtain a model with better accuracy, or a model with shorter execution time, or a model with the smaller parameter space. In another implementation, the probe master service 300 may, based on the model KPI leaderboard, analyze one or more categories of KPIs to obtain a model with the best performance. The probe master service 300 may perform probe event processing and rules, and based on the result of the probe event processing and rules, the probe master service 300 may adjust one or more hyperparameters of the model. The probe master service 300 may store the one or more KPIs of the model in a database.

In one embodiment, a model control platform stack may enforce automated evaluation of one or more KPIs to determine a performance ranking among models. In one implementation, algorithms and tuning levels may be continually evaluated and selected. KPIs may include one or more of the following: receiver operating characteristic (ROC), area under the curve (AUC) type analyses, precision/recall—F1 score, confusion matrix, prediction model accuracy vs actual, or other performance indicators. The one or more KPIs may be used to determine the model rankings. In another implementation, these metrics based on one or more KPIs may be combined with operating system (OS) level metrics and cross validation techniques, such as k-fold or other validation techniques.

In another embodiment, the model control platform stack may provide monitoring/early warning to a live system. In one implementation, the model control platform stack may serve as a "sandbox" for experimentation and/or optimization prior to live deployment, model comparison and ranking, ensemble model outputs, and/or other services. In another implementation, the model control platform stack may be used with a live system (e.g., for monitoring/early warning) and in conjunction for experimentation (e.g., using historical data or other available training data) without necessarily having an immediate connection to a live system.

The model control platform stack may maintain an inventory of probes, and select one or more probes from the probe inventory to monitor performance of one or more models for active failure detection/correction/avoidance, model training, and system stability/security improvements. The model control platform stack may improve the performance, stability, accuracy, efficiency, and security of the underlying modeling hardware and the technical systems monitored by the models operating within the testbed. Hence, the model control platform stack may provide improvements over existing solutions available in the market and a technical solution to a technical problem.

FIGS. 4-7 describe an embodiment of a model control platform stack to provide a probe master service, and a method for a model control platform stack to provide a probe master service.

A stack may refer to a multi-layered computer architecture that defines the interaction of software and hardware resources at the multiple layers. The Open Systems Interconnection (OSI) model is an example of a stack-type architecture. The layers of a stack may pass data and hardware resources among themselves to facilitate data processing. Accordingly, the multiple-layer stack architecture of the model control platform stack may improve the functioning of the underlying hardware.

Figure 4:
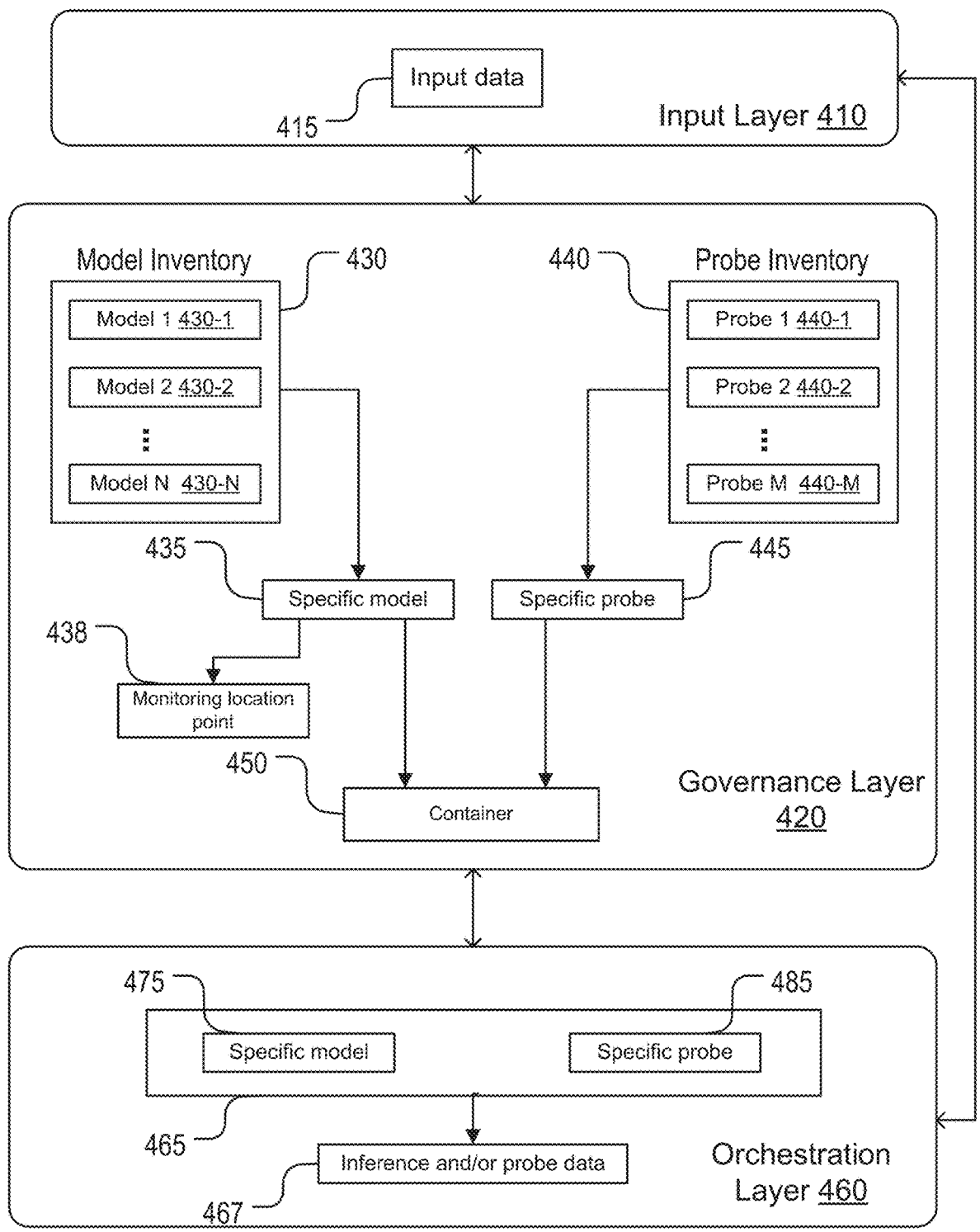
FIG. 4 shows a schematic diagram of an embodiment of a model control platform stack.

Referring to FIG. 4, the model control platform stack may include all or a portion of the following: an input layer 410, a governance layer 420, and an orchestration layer 460.

In one implementation, a model control platform stack may be implemented on model control platform circuitry. The model control platform stack may include an input layer 410, which may handle data reception (e.g., extraction, transformation, and/or loading of data). The model control platform stack may include a governance layer 420, which may handle model/probe inventory and deployment to active execution. The model control platform stack may include an orchestration layer 460, which may handle scheduling and operation of deployed probe and model images.

Optionally, in another implementation, the model control platform stack may include an interface layer, which may handle presentation of probe/model outputs, parameters, options, controls or other interface elements to interfaces for operators and/or control systems. Additionally or alternatively, the interface layer may support one or more application programming interfaces (APIs) for integration with various client system.

Optionally, in another implementation, may include a communication layer, which may handle or provide networking resource access for the other layers, for example but not limited to, hardware access to the model control platform stack. As one example, for the model control platform stack, the communication layer may provide the input layer with network interface circuitry resources to send or otherwise provide an interface over a hardware network architecture. The communication layer may provide a hardware resource, e.g., network interface circuitry resources, to the input layer.

Referring to FIG. 4, an input layer 410 of a model control platform stack may receive input data 415. Referring to FIG. 5, the method may include, for a functionality of the input layer of the model control platform stack, step 510: receiving, by a circuitry comprising a memory storing instructions for the model control platform stack and a processor in communication with the memory, input data. In one implementation, for example, the input data may include all or a portion of the following: training data, historical data, real-time (or near-real-time) operation from a live system for active monitoring, or other data. In another implementation referring to step 520 in FIG. 5, the input data may come from a live deployment and may be used to create an early warning system for the live deployment.

Figure 6:
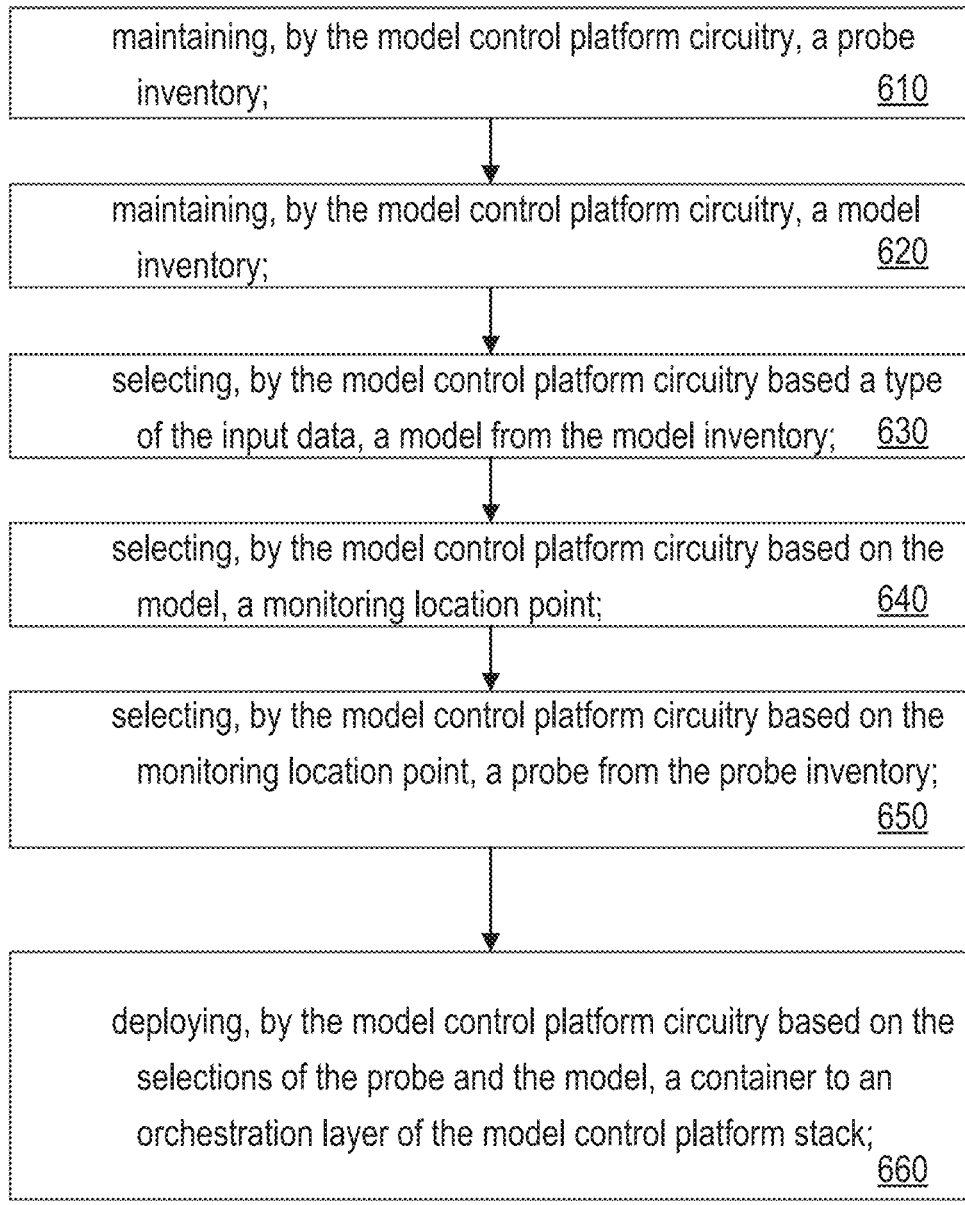
FIG. 6 shows a flow diagram of an embodiment of another method using a model control platform stack.

Referring to FIG. 4, a governance layer 420 of the model control platform stack may include a model inventory 430. The model inventory 430 may include one or more models. In one implementation, the model inventory 430 may include N models with N being a positive integer, for example, model 1 (430-1), model 2 (430-2), . . . , and model N (430-N). The governance layer 420 of the model control platform stack may include a probe inventory 440. The probe inventory 440 may include one or more probes. In one implementation, the probe inventory 440 may include M probes with M being a positive integer, for example, probe 1 (440-1), probe 2 (440-2), . . . , and probe M (440-M). Referring to FIG. 6, the method may include, at the governance layer of the model control platform stack, step 610: maintaining, by the circuitry, a probe inventory; and step 620: maintaining, by the circuitry, a model inventory.

Referring to FIGS. 4 and 6, the method may further include, at the governance layer of the model control platform stack, step 630: selecting, by the circuitry based a type of the input data 415, a model 435 from the model inventory 430; step 640: selecting, by the circuitry based on the model 435, a monitoring location point 438; and step 650: selecting, by the circuitry based on the monitoring location point 438, a probe 445 from the probe inventory 440. In one implementation, the monitoring location point may be one or more of the following: a performance metric for the model; a memory location for an operating system on which the orchestration layer executes; sensory data from at least one sensor; an accuracy metric for the model; or an inter-model comparison. The sensory data may be obtained from a variety of sensor types, for example but not limited to, component temperature, proximity, pressure, water quality, chemical, gas, smoke, IR, fluid level, image, or any sensor capable of generating a signal that can be used in digital signal processing and near real time analysis.

The model 435 may be a specific model selected from the one or more models in the model inventory 430 based on the type of the input data 415 transmitted from the input layer 410.

In one implementation, the probe 445 may be a specific probe selected from the one or more probes in the probe inventory 440 based on the monitoring location point 438. In another implementation, the probe 445 may be a specific probe selected from the one or more probes in the probe inventory 440 based on the monitoring location point 438 and the model 435.

Referring to FIGS. 4 and 6, the method may further include, at the governance layer of the model control platform stack, step 660: deploying, by the circuitry based on the selections of the probe 445 and the model 435, a container 450 to an orchestration layer of the model control platform stack. Additionally or alternatively, the step 660 may include injecting, by the circuitry, the probe 445 into the container 450.

In one implementation, more than one monitoring location points may be selected based on the model 435. One or more probes may be selected from the probe inventory based on the more than one monitoring location points. The governance layer of the model control platform stack may deploy the one or more probes to the orchestration layer.

In another implementation, more than one models may be selected based on the input data, and more than one monitoring location points may be selected based on the more than one models. The governance layer of the model control platform stack may deploy the one or more models to the orchestration layer.

Figure 7:
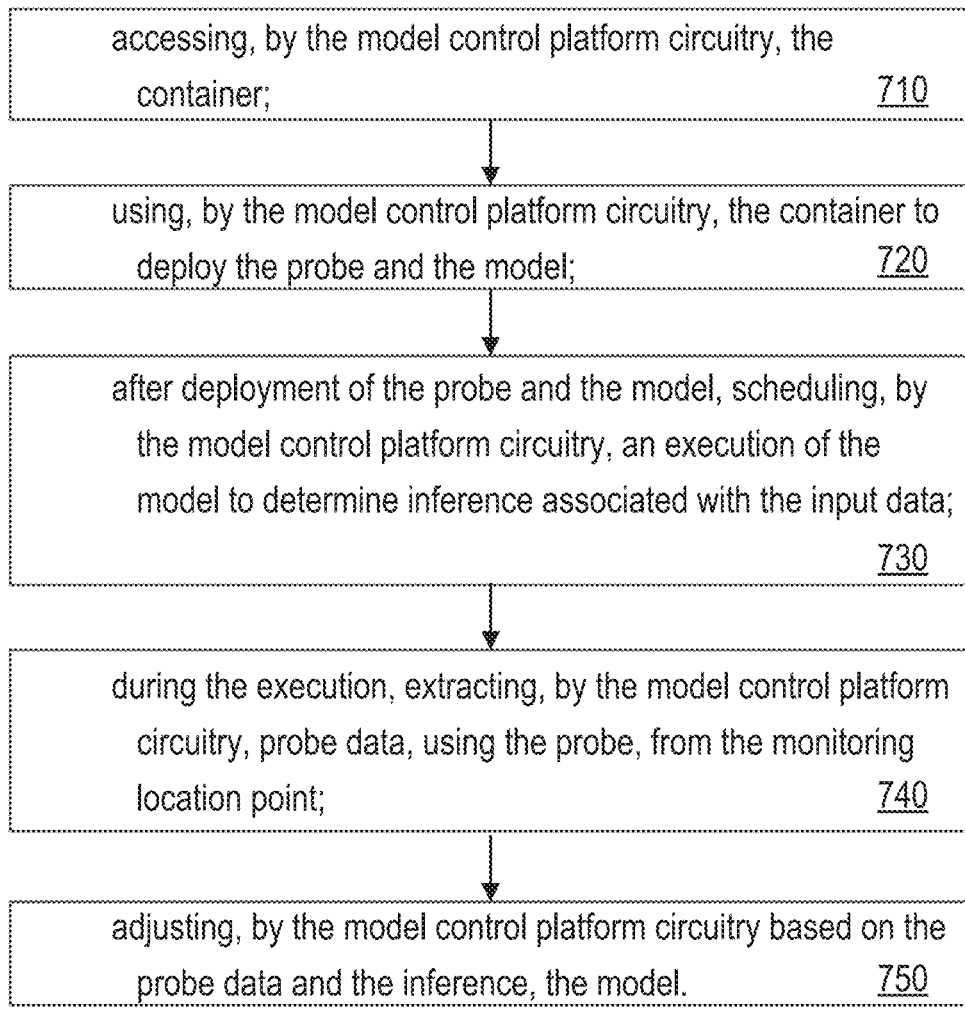
FIG. 7 shows a flow diagram of an embodiment of another method using a model control platform stack.

Referring to FIGS. 4 and 7, an orchestration layer 460 may include a container 465 received from the governance layer 420. The method may include, at the orchestration layer 460 of the model control platform stack, step 710: accessing, by the circuitry, the container 465; and step 720: using, by the circuitry, the container 465 to deploy the probe 485 and the model 475.

The method may further include, at the orchestration layer 460 of the model control platform stack, step 730: after deployment of the probe 485 and the model 475, scheduling, by the circuitry, an execution of the model 475 to determine inference 467 associated with the input data; and step 740: during the execution, extracting, by the circuitry, probe data 467, using the probe 485, from the monitoring location point 438. In one implementation, the probe 485 may generate an ensemble output during the execution of the model 475.

In one implementation, the container may include more than one models and/or probes. The model control platform stack may execute and evaluate the more than one models to determine an inference and extract probe data using multiple parallel models probed at multiple monitoring location points. In one implementation, the determined inference may include a predicted result associated with the input data, and the extracted probe data may include actual result during the execution of the model.

The method may further include, at the orchestration layer 460 of the model control platform stack, step 750: adjusting, by the circuitry based on the probe data and the inference, the model. In one implementation, one or more hyperparameters of the model may be adjusted based on the difference between actual result in the probe data and the predicted result in the inference. In another implementation, one or more other parameters of the model may be adjusted based on the difference between actual result in the probe data and the predicted result in the inference.

Figure 8:
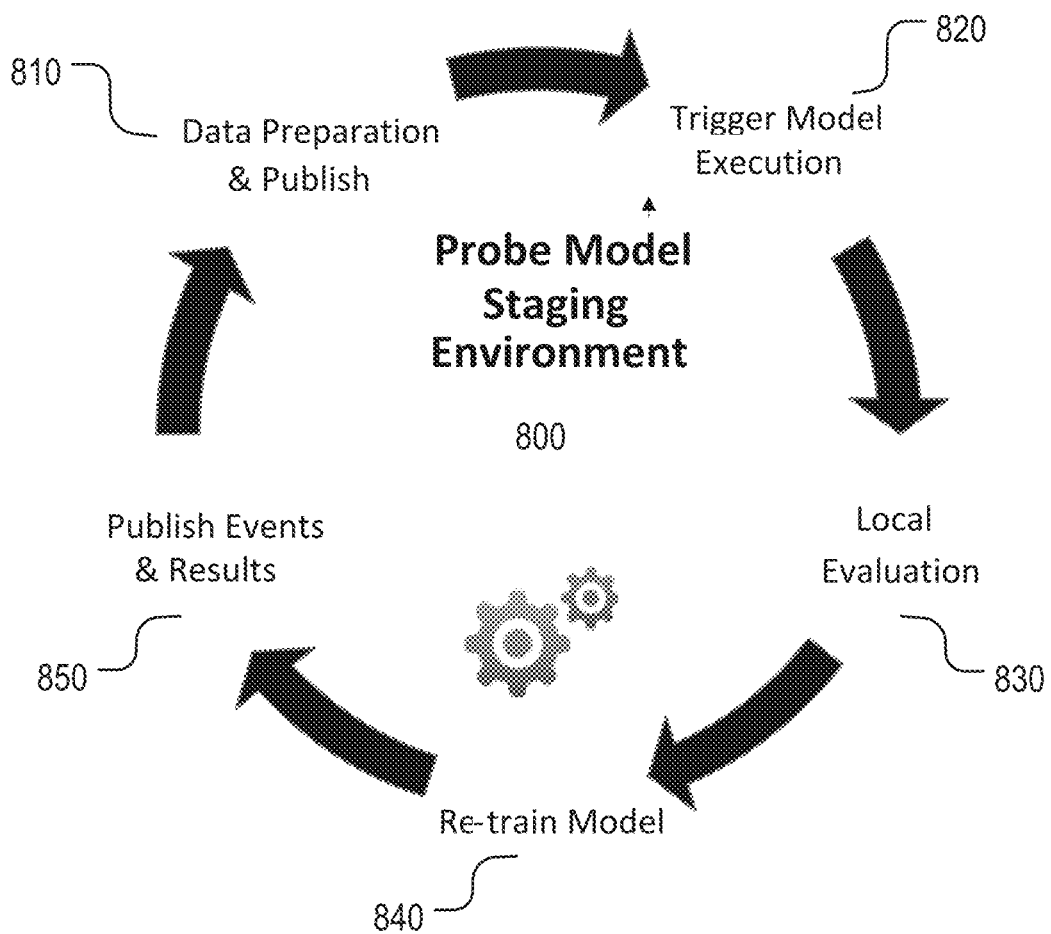
FIG. 8 shows a schematic diagram of an embodiment of a probe model staging environment.

In one embodiment, FIG. 8 describes a probe model staging environment 800. The probe model staging environment 800 may train, test, and/or monitor one or more staging models. In one implementation, the one or more staging models may be the models selected from the model inventory in step 630 in FIG. 6. In another implementation, a model control platform stack may use a container to deploy a selected probe and a selected model into the probe model staging environment 800.

Referring to FIG. 8, the probe model staging environment 800 may include all or a portion of the following steps. In step 810, input data may be received, prepared, and/or published by one or more staging models. In step 820, the one or more staging models may be trigged and begin execution based on the input data. In step 830, probe data may be extracted with one or more probes, resulting in local evaluation of the one or more models. In step 840, based on the result of local evaluation, the one or more models may be re-trained for better performance. In step 850, events and results may be published based on the probe data and the local evaluation result. Optionally, the probe model staging environment 800 may begin next round of iteration by continuing step 810.

Figure 9:
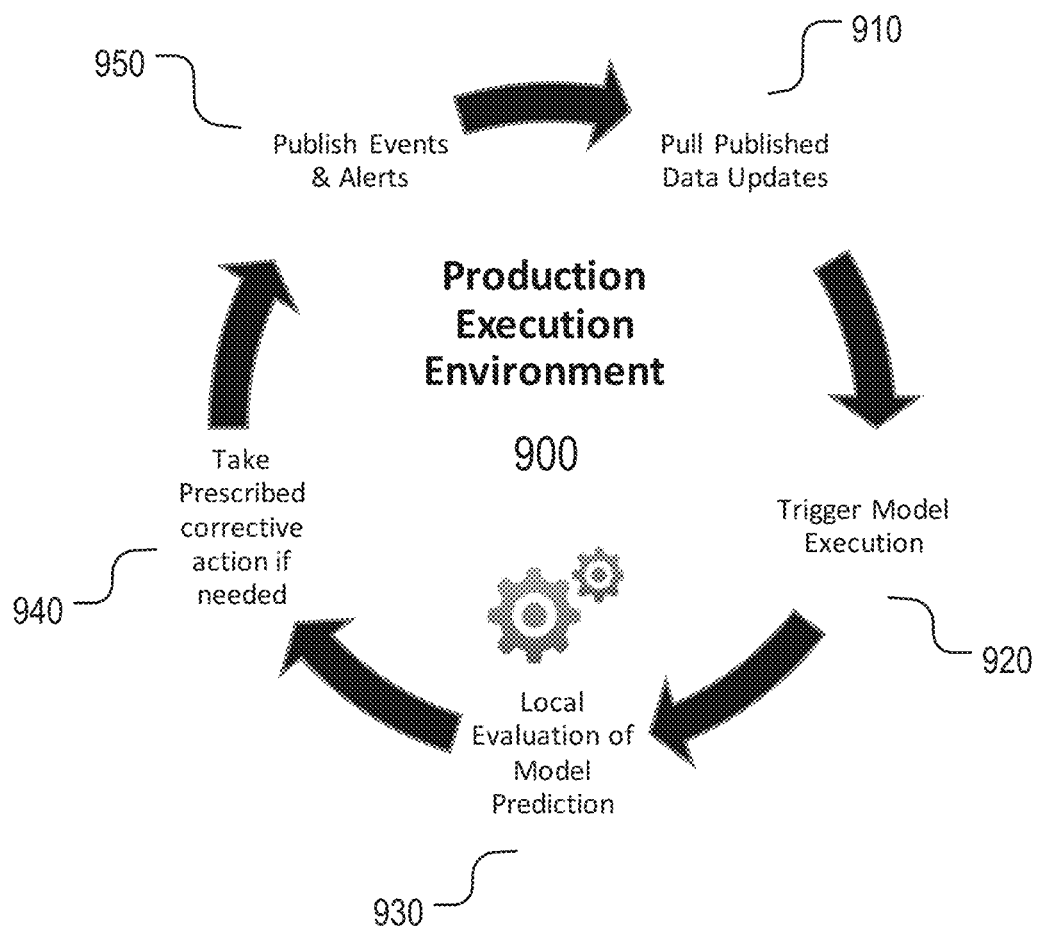
FIG. 9 shows a flow diagram of an embodiment of a production execution environment.

In another embodiment, FIG. 9 describes a production execution environment 900. The production execution environment 900 may execute one or more production models, monitor performance of the one or more production models, and/or provide early warning of the one or more production models. In one implementation, a production model may be a selected model from the model inventory in step 630 in FIG. 6. In another implementation, a model control platform stack may use a container to deploy a selected probe and a selected model into the production execution environment 900. In another implementation, a production model may be a selected model from a model leaderboard based on one or more key performance indicators (KPIs).

Referring to FIG. 9, the production execution environment 900 may include all or a portion of the following steps. In step 910, input data and/or published data updates may be pulled may be received, prepared, and/or published by one or more production models. In step 920, the one or more production models may be trigged and begin execution based on the input data and/or the published data updates. In step 930, probe data may be extracted with one or more probes, resulting in local evaluation of model prediction of the one or more models. In step 940, based on the result of local evaluation, one or more prescribed corrective actions may be generated and/or applied upon the one or more production models. The one or more production models with taking the one or more prescribed corrective actions may achieve better performance. In step 950, events, results, and/or alerts may be published based on the probe data and/or the local evaluation result. Optionally, the production execution environment 900 may begin next round of iteration by continuing step 910.

Figure 10:
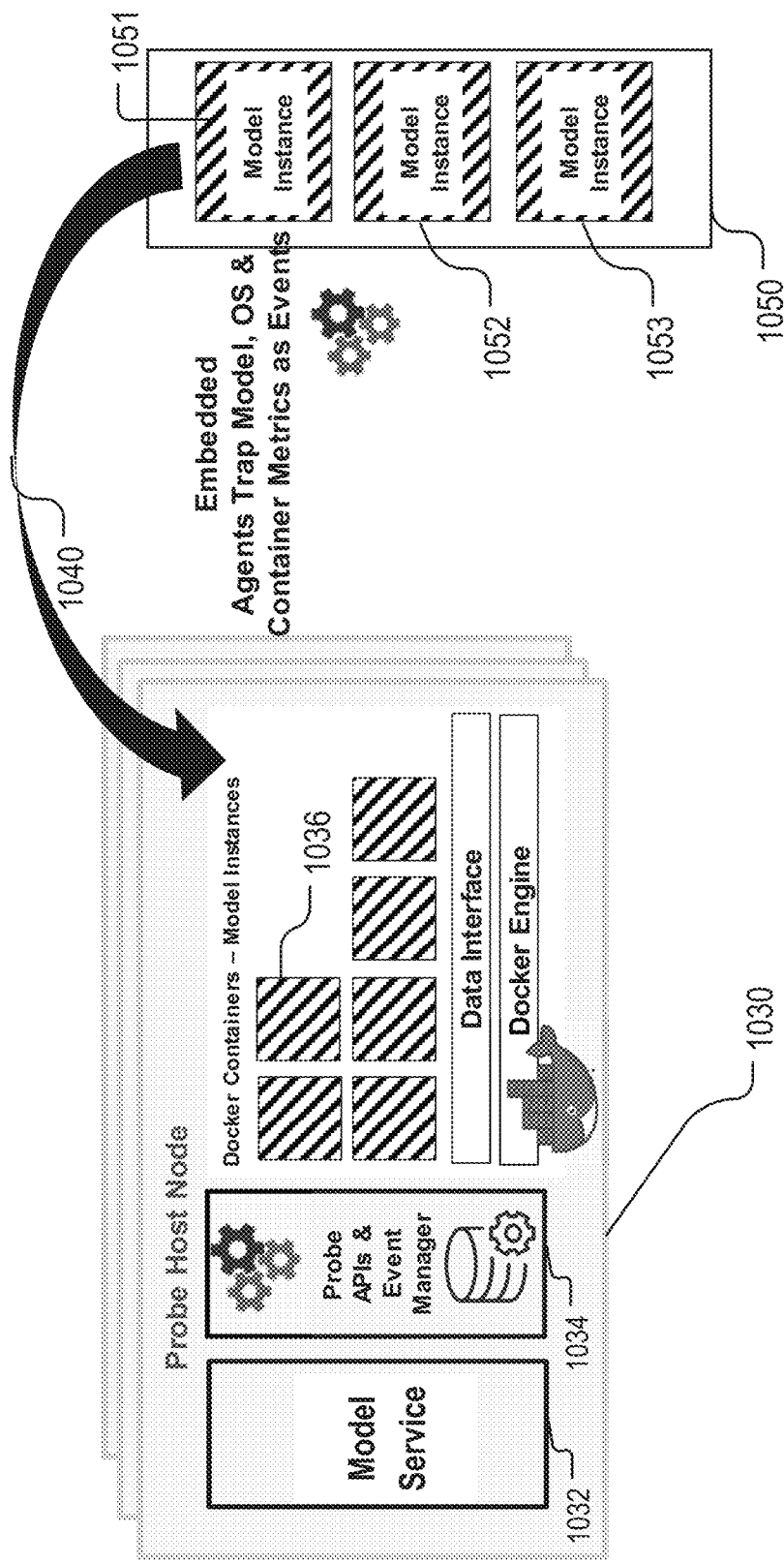
FIG. 10 shows a schematic diagram of an embodiment of a probe host node.

In one implementation referring to FIG. 10, model probe APIs and agents may support testing, tuning, and/or training models. One or more agents may be embedded in a model 1051 to collect data. The collected data may include operation system (OS) metrics, container metrics, and/or model telemetry. The model 1051 may send the collected data as one or more events 1040 to a probe host node 1030. In one implementation, a set of models 1050 may include the model 1051 and one or more other models (1052 and 1053). In one implementation, a model instance may begin with a set of codes in a code repository. The set of codes may be injected into an image. The image may be deployed to become a container instance.

The probe host node 1030 may include one or more of the following services: model service 1032, and/or a probe service 1034. In one implementation, one model instance (e.g., the model 1051) may be deployed into the probe host node to become the model service 1032. The model 1051 may embed the agent continuously collecting data and feeding the data to an event manager in the probe service 1034. In one implementation, a model instance may begin with a set of codes in a code depository. The set of codes may be injected into an image. The image may be deployed to become a container instance 1036. In another implementation, a docker registry service may store one or more images.

One or more probe APIs in the probe service 1034 may execute, train, and/or test the model. In one implementation, the probe service 1034 may monitor model metrics, re-train model metrics, and/or evaluate model performance KPIs, to optimize hyperparameters.

Figure 11:
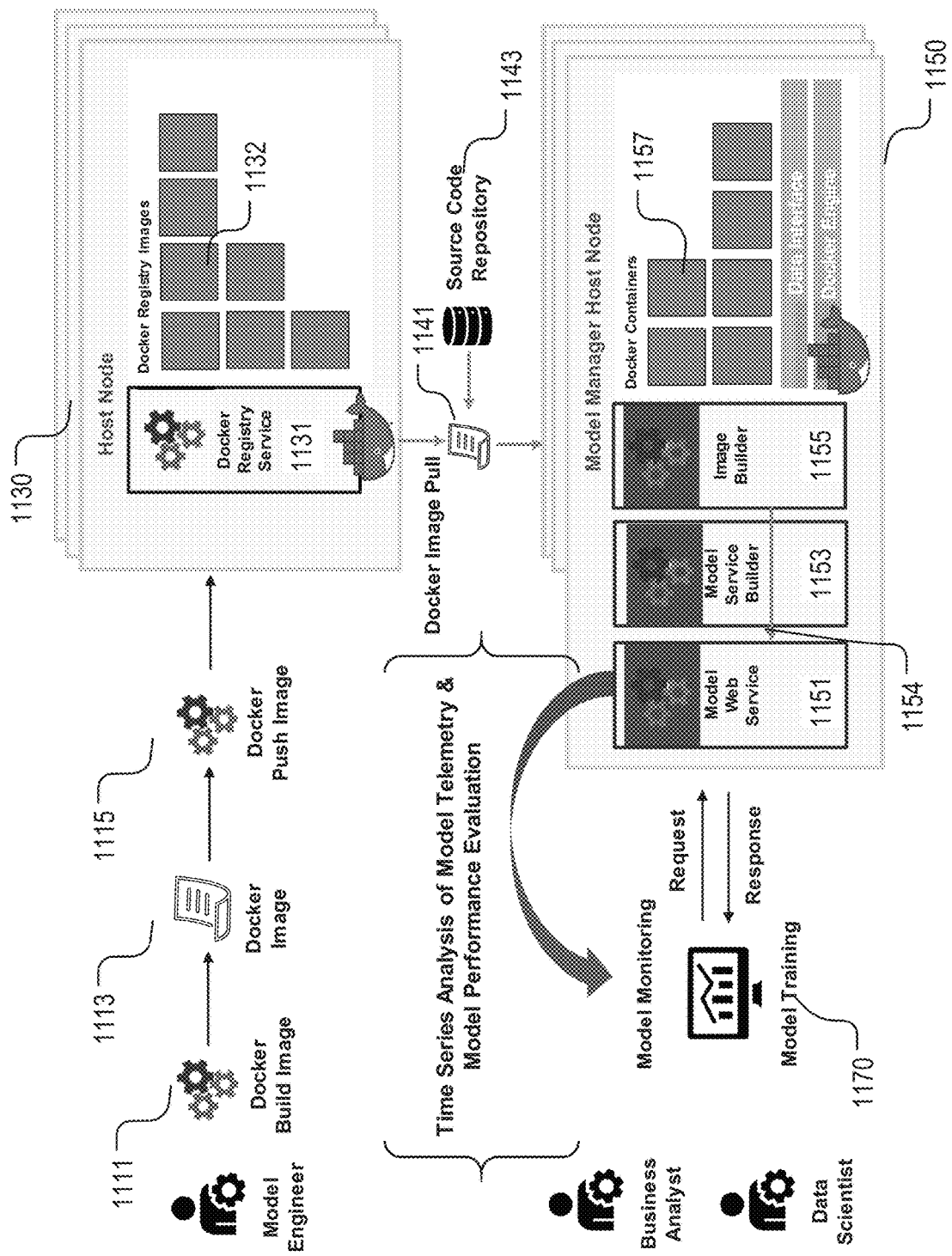
FIG. 11 shows a schematic diagram of an embodiment of a host node and/or a model manager host node.

In another implementation referring to FIG. 11, a host node 1130 may include a docker registry service 1131, which may store one or more docker registry images 1132. The one or more docker registry images 1132 may be general purpose images embedding a general purpose API. The general purpose API may be injected by the docker 1111 to build a docker image 1113. The docker 1115 may push the docker image to the host node. Optionally, model codes from the source code repository 1143 may be injected into a docker image 1141 to be deployed to a model manager host node 1150. The model manager host node 1150 may include one or more of the following: an image builder 1155, a model service builder 1153, and a model web service 1151. The image builder 1155 may build a model image 1154 based on one or more docker containers 1157 and send the model image 1154 to the model web service 1151. The model web service 1151 may respond to model training and monitoring 1170.

In another implementation, a production model manager host node or cluster may store one or more production docker containers, which may embed one or more production models. One of the production models may be a champion model. The champion model may be executed in the production execution environment 900 in FIG. 9. Optionally, a staging model manager host node or cluster may store one or more staging docker containers, which may embed one or more staging models. One of the staging models may be a challenger model. The challenger model may be executed in the staging environment 800 in FIG. 8.

In one implementation, one or more agents and/or probes may collect data to generate model performance metrics based on the collected data. Model performance, including model "drift" and/or model accuracy, may be determined based on model performance metrics. For one example, the model performance may include a portion or all of the following metrics: model accuracy; precision/recall (F1 score); receiver operating characteristic curve (ROC), area under an ROC curve (AUC), or confusion matrix; confidence interval; r-squared (R2), mean squared error (MSE), mean absolute error (MAE), mean percentage error (MPE), or mean absolute percentage error (MAPE); or model latency.

One or more model performance metrics may be analyzed over a period of time. For one example, an early warning model may include anomaly detection. For another example, a model for generating short or long term trends may detect the actual data vs. prediction. For another example, a model may be generated for determining seasonality, cyclicity, anomaly detection, and/or irregularity.

In one implementation, the prediction may include an expected result based on a historical pattern or an averaged result over a time period. The historical pattern may include patterns of seasonality, patterns over a weekly cycle, or patterns over a daily cycle. The averaged result may include averaged results over last 24 hours or last 365 days.

Figure 12:
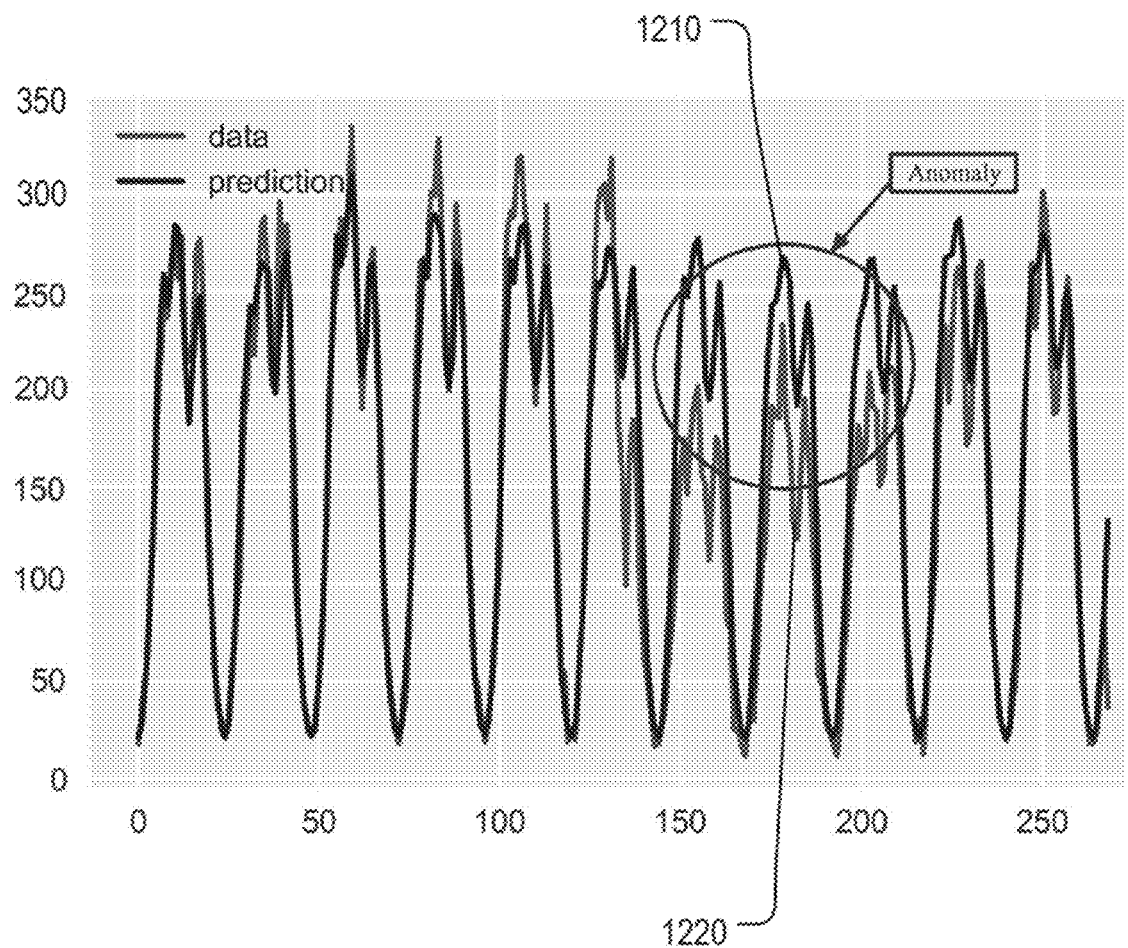
FIG. 12 shows a schematic diagram of an embodiment of an anomaly between data and prediction.

For one example referring to FIG. 12, the time series analysis of the model metrics may analyze abnormality between a prediction 1210 and data 1220 collected by the one or more agent and/or probes. For another example, an early warning prediction model may use one or more the following methods: seasonal trend decomposition based on LOESS (STL), trees, auto-regressive integrated moving average (ARIMA); and/or Fourier extrapolation.

Figure 13A:
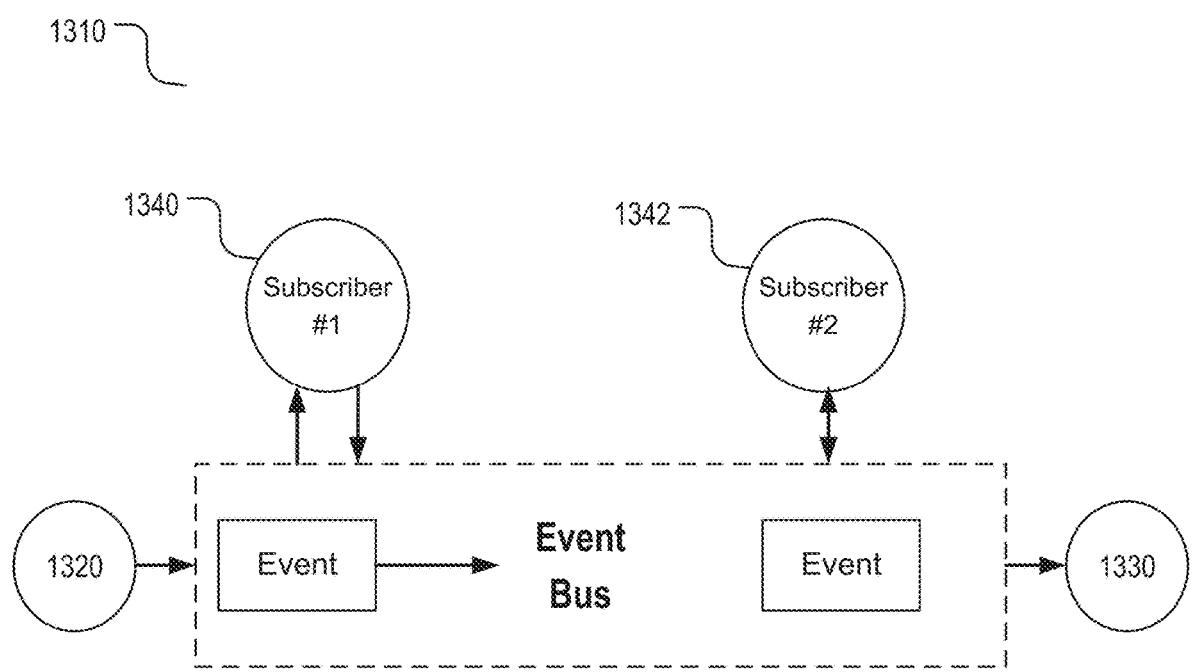
FIG. 13A shows a schematic diagram of an embodiment of an event bus.

The present disclosure describes various embodiments of probe master service including at least one event bus implementation. FIG. 13A shows a schematic diagram of an event bus 1310. A event producer 1320 may produce one or more event and send the event to an event bus. One or more subscribers (1340 and 1342) may process the event data with their own logic and/or in communication with their own database. The one or more subscribers (1340 and 1342) may create one or more new event based on data of the processed event, and pass the new events to the event bus. The event bus 1310 may pass the event to another event bus or an intermediary 1330 for further processing.

The event producer 1320 may include one or more hardware device, or one or more probe API through one or more probe agent. The event may have event data including at least one of an event ID, a time stamp, or a value. The event bus API may provide event handling with ability to route events to network clients using TCP/IP, notifying subscribers about the event, sending events to intermediary processes for further processing. The subscriber may subscribe certain events to the event bus based on some event matching criteria, and the subscriber may receive acknowledgement of subscription from the event bus. The subscriber may also listen and read one or more event in the event bus as individual records or streams.

Figure 13B:
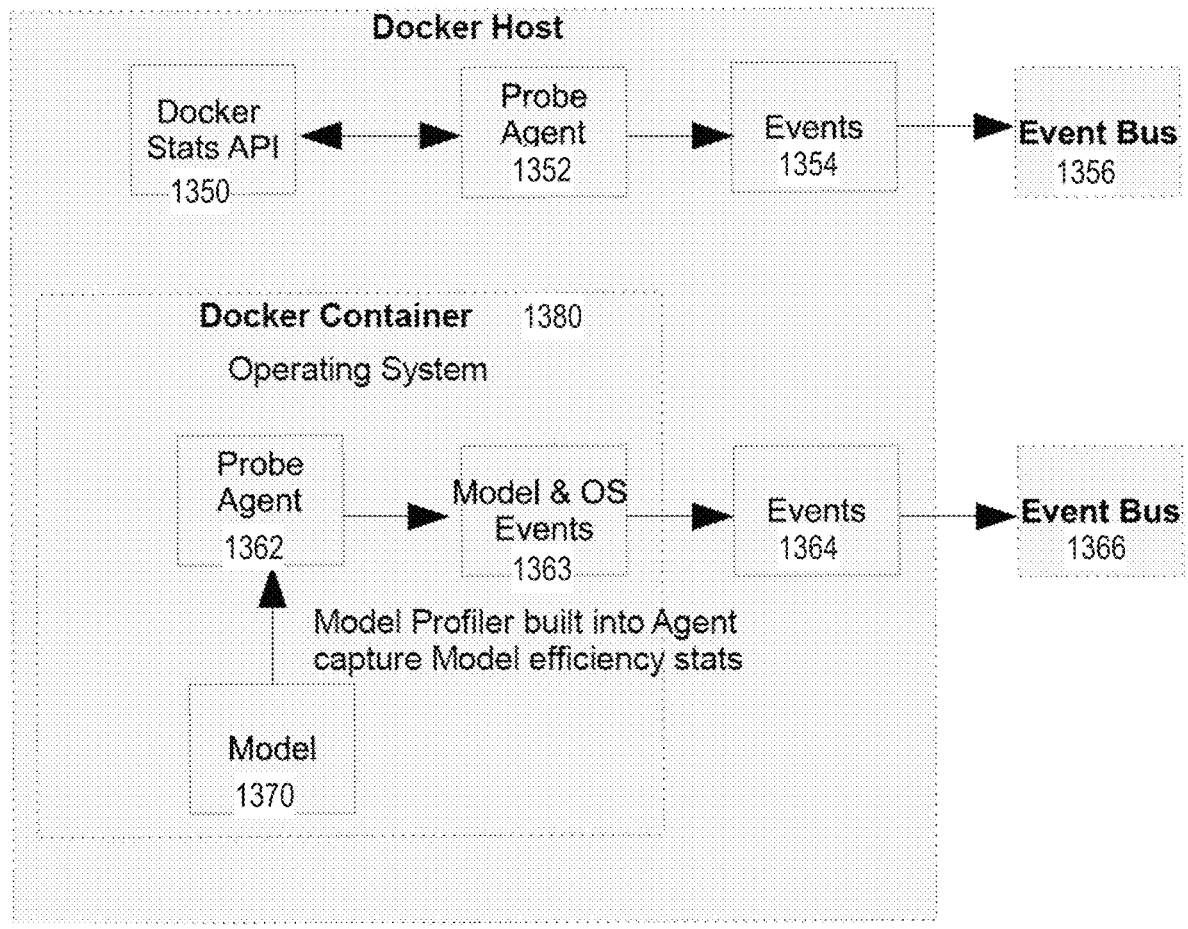
FIG. 13B shows a schematic diagram of an embodiment of one or more probe agent producing one or more events and sending the one or more events to one or more event bus.

In one implementation as shown in FIG. 13B, the events may be produced by one or more probe agent. The one or more probe agent may be embedded at the operating-system (OS) level and/or at the model level. The probe agents may be configured to trap error conditions specific to OS, hosting model, model processes, which includes file system input-output, central processing unit (CPU), and network input-output, or model profiling data. The events produced by the probe agents may be used to analyze the algorithmic efficiency of the model. A probe agent 1352 may be in communication with one or more docker stats API 1350. The probe agent 1352 may produce one or more events 1354 and send the one or more events 1354 into an event bus 1356. A second probe agent 1362 may be in communication with a model 1370, and produce model related events and/or OS-related events 1363. The second probe agent 1362 may be embedded in a docker container 1380, and send out the one or more event 1364 into an event bus 1366. In one implementation, the event bus 1356 and the event bus 1366 may be a same event bus.

Figure 14:
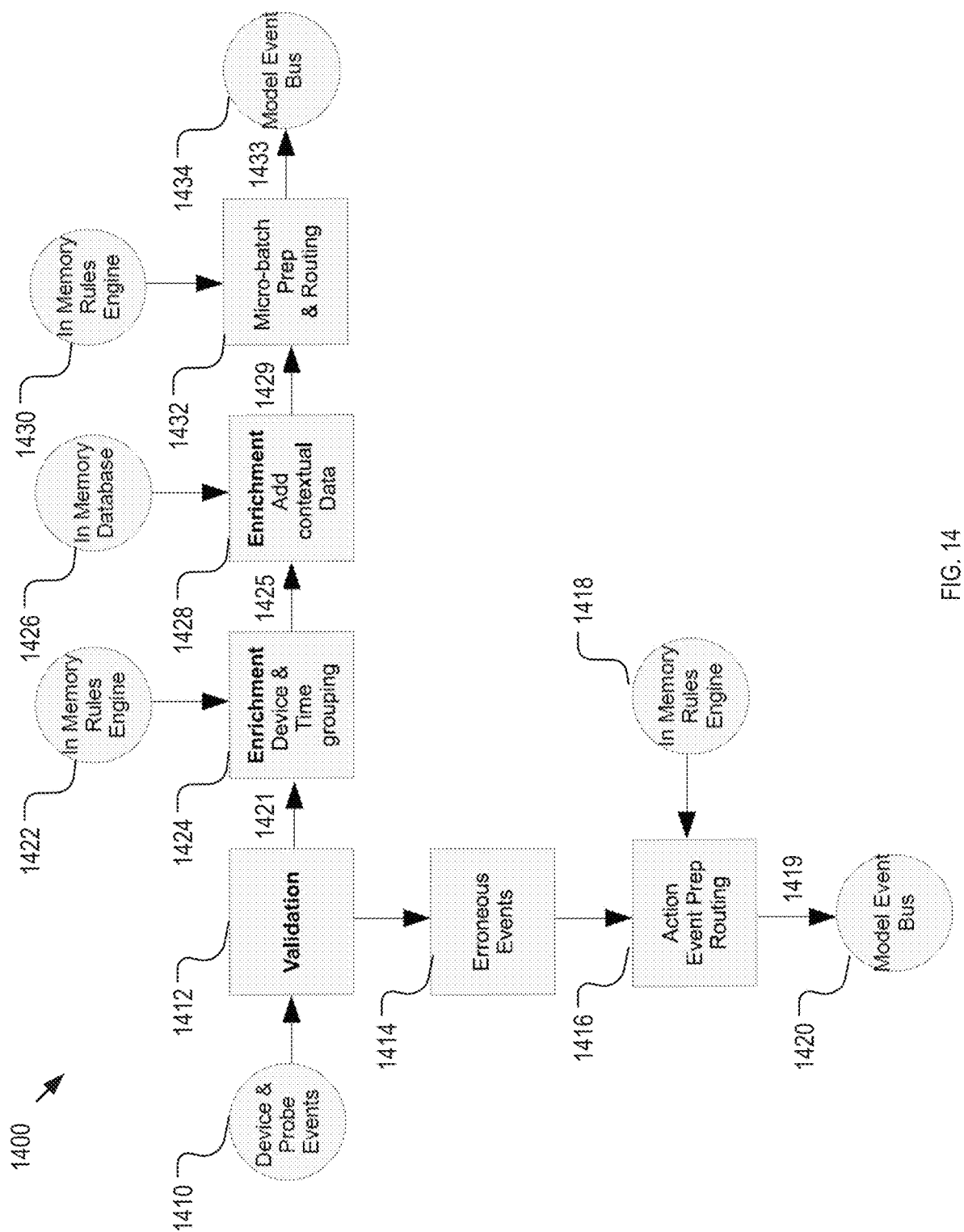
FIG. 14 shows a schematic diagram of an embodiment of a device and probe event bus.

FIG. 14 shows a schematic diagram of an implementation of a device and probe event bus 1400. The device and probe event bus 1400 may receive an event 1410 from a device and/or a probe agent. The device and probe event bus 1400 may include a validation subscriber 1412. The validation subscriber 1412 may determine whether the event 1410 is valid or not. When it is determined the event 1410 is valid, the device and probe event bus 1400 may include a first enrichment subscriber 1424. The first enrichment subscriber 1424 may be in communication with an in-memory rules engine 1422 to enrich the event 1421 based on the device producing the event and/or time grouping. The device and probe event bus 1400 may include a second enrichment subscriber 1428. The second enrichment subscriber 1428 may be in communication with an in-memory database 1426 to enrich the event 1425 by adding contextual data to the event.

The device and probe event bus 1400 may include a subscriber 1432. The subscriber 1432 may be in communication with an in-memory rules engine 1430 to perform micro-batch preparation of the event 1429 and route the event 1433 to a model event bus 1434. In one implementation, the subscriber 1432 may batch the event 1429 based on a time window. The time window may be a time duration, for example but not limited to, 2 seconds, or 3 minutes, so that the subscriber 1432 may batch one or more events within the time window as a group of events and route the group of events together.

When it is determined the event 1410 is not valid, for example being as an erroneous event 1414, the device and probe event bus 1400 may include a subscriber 1416. The subscriber 1416 may be in communication with an in-memory rules engine 1418 to perform action event preparation of the event 1414 and route the event 1419 to a model event bus 1420. In one implementation, the model event bus 1420 and the model event bus 1434 may be a same model event bus 1500 as shown in FIG. 15.

Figure 15:
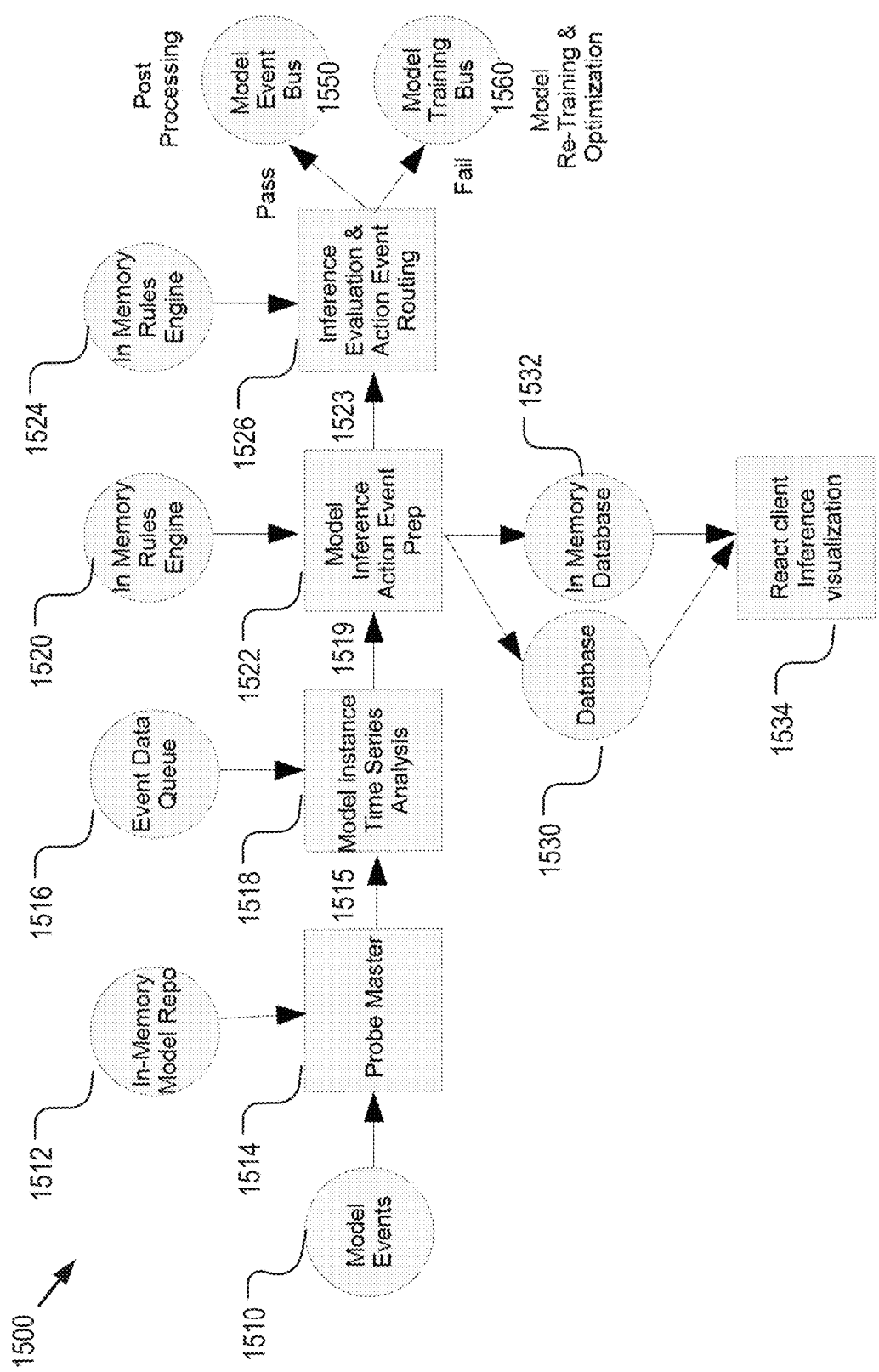
FIG. 15 shows a schematic diagram of an embodiment of a model event bus.

FIG. 15 shows a schematic diagram of an implementation of a model event bus 1500. The model event bus 1500 may receive one or more model event 1510. The model event 1510 may be the event 1419 and/or the event 1433 from FIG. 14. The model event bus 1500 may include a probe master subscriber 1514 in communication with an in-memory model repository 1512. The model event bus 1500 may include a subscriber 1518. The subscriber 1518 may access previous event data from an event data queue 1516 to analyze the event 1515 to perform model instance time series analysis based on the event data queue 1516 and the event 1515. The model event bus 1500 may include a subscriber 1522. The subscriber 1522 may be in communication with an in-memory rules engine 1520 to perform model inference and action event preparation. In one implementation, the subscriber 1522 may route the event 1519 to a database 1530 and/or an in-memory database 1532. A subscriber 1534 may react to client's inquiry, determine inference based on the database 1530 and/or the in-memory database 1532, and provide a visualization of the inference. The inference may include a predicted result.

The model event bus 1500 may include a subscriber 1526. The subscriber 1526 may be in communication with an in-memory rules engine 1524 to perform inference evaluation and route the event 1523. In one implementation, the inference may include a predicted result, and the subscriber 1526 may determine whether the current execution model passes the evaluation. When a difference between the analyzed model result and the predicted result is within a preset threshold, the subscriber 1526 determines that the current execution model passes the evaluation; and when the difference between the analyzed model result and the predicted result equals or is larger than the preset threshold, the subscriber 1526 determines that the current execution model fails the evaluation. When it is determined that the current execution model passes the evaluation, the subscriber 1526 may route the event 1523 to a model event bus 1550 for post processing. When it is determined that the current execution model fails the evaluation, the subscriber 1526 may route the event 1523 to a model training bus 1560 for model re-training and/or optimization. In one implementation, the model training bus 1560 may be a model training bus 1600 in FIG. 16. The preset threshold may be determined based on derivation and/or variation of historical result, and/or may be determined/adjusted by a service operator.

Figure 16:
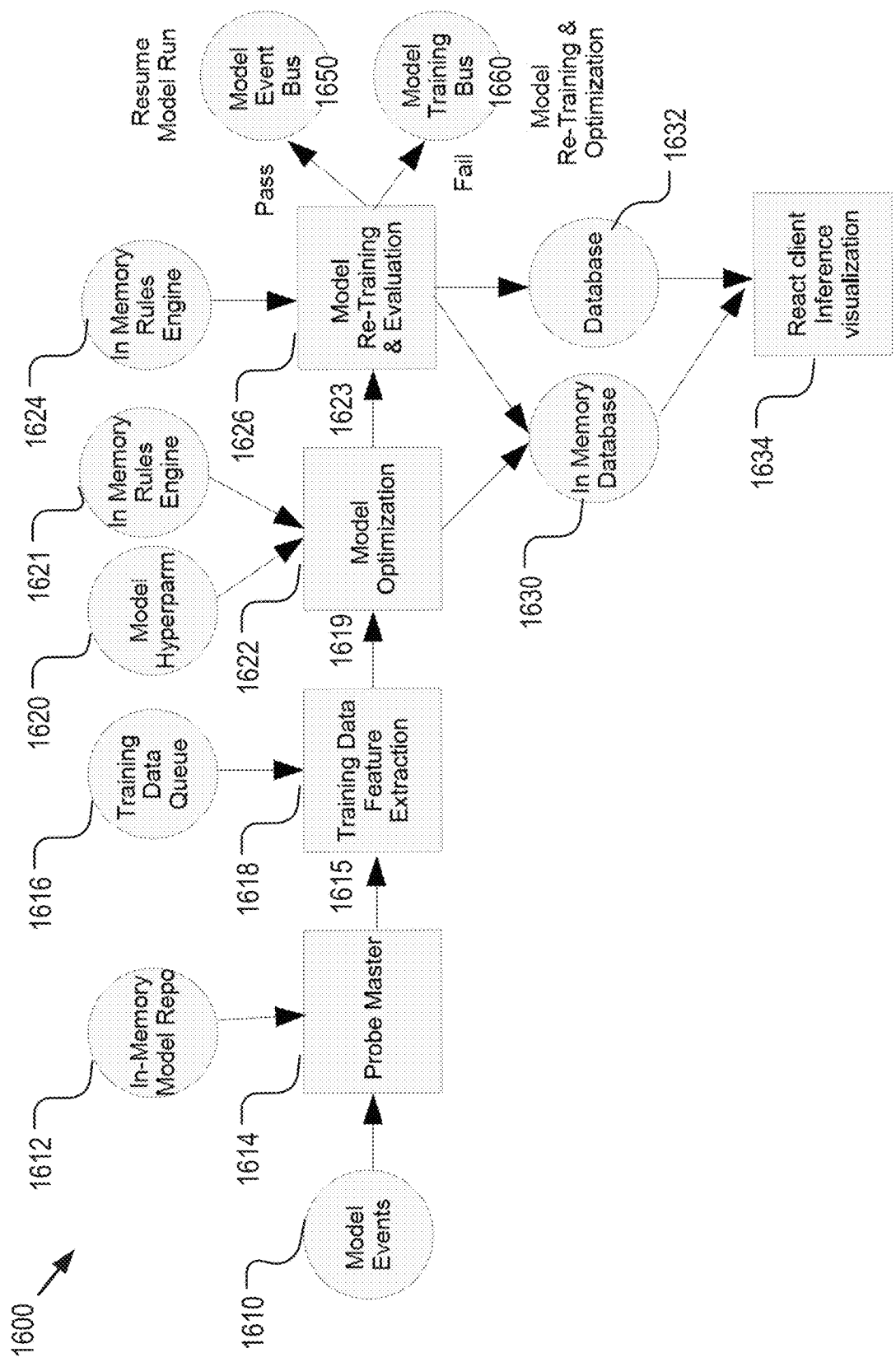
FIG. 16 shows a schematic diagram of an embodiment of a model training bus.

FIG. 16 shows a schematic diagram of an implementation of a model training bus 1600. The model training bus 1600 may receive one or more model event 1610. The model event 1610 may be at least one of the following events: the event 1419 from FIG. 14, the event 1433 from FIG. 14, or the event 1523 from FIG. 15. The model training bus 1600 may include a probe master subscriber 1614 in communication with an in-memory model repository 1612. The model training bus 1600 may include a subscriber 1618. The subscriber 1618 may obtain previous training data from a training data queue 1616. The subscriber 1618 may extract one or more training data feature based on the event 1615 and the previous training data. The model training bus 1600 may include a subscriber 1622. The subscriber 1622 may be in communication with a model hyperparm 1620 and/or an in-memory rules engine 1621. The model hyperparm 1620 may include at least one set of hyperparameters for the model. The subscriber 1622 may optimize the model based on the event 1619 and the at least one set of hyperparameters. In one implementation, the subscriber 1622 may route the event 1619 to an in-memory database 1630.

The model training bus 1600 may include a subscriber 1626. The subscriber 1626 may be in communication with an in-memory rules engine 1624 to re-train and/or evaluate the model based on the model optimization in 1622 and/or the event 1623. In one implementation, the subscriber 1626 may route the event 1623 and/or the re-training and evaluation results to an in-memory database 1630 and/or a database 1632. A subscriber 1634 may react to client's inquiry, determine inference based on the database 1632 and/or the in-memory database 1630, and provide a visualization of the inference. The model re-training in 1626 may be based on the model optimization in 1622.

The model evaluation in 1626 may be based on a comparison of the model result and a predicted result. When a difference between the model result and the predicted result is within a preset threshold, the subscriber 1626 determines that the current model passes the evaluation; and when the difference between the model result and the predicted result equals to or is larger than the preset threshold, the subscriber 1626 determines that the current model fails the evaluation. When it is determined that the current model passes the evaluation, the subscriber 1626 may route the event 1623 to a model event bus 1650 for resuming a running of the model. When it is determined that the current model fails the evaluation, the subscriber 1626 may route the event 1623 to a model training bus 1660 for model re-training and/or optimization. The preset threshold may be determined based on derivation and/or variation of historical result, and/or may be determined/adjusted by a service operator.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be embodied as a signal and/or data stream and/or may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may particularly include a storage medium and instructions stored in or on the medium, and the instructions when executed by the circuitry in a device may cause the device to implement any of the processing described above or illustrated in the drawings.

The implementations may be distributed as circuitry, e.g., hardware, and/or a combination of hardware and software among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

Various implementations have been specifically described. However, many other implementations are also possible. For example, the example implementations included within the drawing sheets are described to be illustrative of various ones of the principles discussed above. However, the examples included within the drawing sheets are not intended to be limiting, but rather, in some cases, specific examples to aid in the illustration of the above described techniques and architectures. The features of the following example implementations may be combined in various groupings in accord with the techniques and architectures describe above. Further, for clarity of presentation and record, various examples are appended to the drawings but are intended to be treated as if added here:

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

While the particular disclosure has been described with reference to illustrative embodiments, this description is not meant to be limiting. Various modifications of the illustrative embodiments and additional embodiments of the disclosure will be apparent to one of ordinary skill in the art from this description. Those skilled in the art will readily recognize that these and various other modifications can be made to the exemplary embodiments, illustrated and described herein, without departing from the spirit and scope of the present disclosure. It is therefore contemplated that the appended claims will cover any such modifications and alternate embodiments. Certain proportions within the illustrations may be exaggerated, while other proportions may be minimized. Accordingly, the disclosure and the figures are to be regarded as illustrative rather than restrictive.

What is claimed is:

1. A method comprising:
    at an input layer of a model control platform stack:
        receiving, by a model control platform circuitry comprising a memory storing instructions for the model control platform stack and a processor in communication with the memory, input data;
    at a governance layer of the model control platform stack:
        maintaining, by the model control platform circuitry, a probe inventory;
        maintaining, by the model control platform circuitry, a model inventory;
        selecting, by the model control platform circuitry based on a type of the input data, a model from the model inventory;
        selecting, by the model control platform circuitry based on the model, a monitoring location point;
        selecting, by the model control platform circuitry based on the monitoring location point, a probe from the probe inventory;
        deploying, by the model control platform circuitry based on the selections of the probe and the model, a container to an orchestration layer of the model control platform stack;
    at the orchestration layer of the model control platform stack:
        accessing, by the model control platform circuitry, the container;
        using, by the model control platform circuitry, the container to deploy the probe and the model;
        after deployment of the probe and the model, scheduling, by the model control platform circuitry, an execution of the model to predict an inference based on the input data, the inference comprises a predicted result;
        during the execution, extracting, by the model control platform circuitry, from the probe, probe data from the monitoring location point; and
        adjusting, by the model control platform circuitry, a hyperparameter of the model based on a difference between actual result in the probe data and the predicted result;
        re-training, by the model control platform circuitry, the model based on the adjusted hyperparameter,
    wherein the monitoring location point comprises a memory location for an operating system on which the orchestration layer executes.

2. The method according to claim 1, wherein the governance layer of the model control platform stack is configured to:
    deploy multiple probes to the orchestration layer; or
    deploy multiple models to the orchestration layer.

3. The method according to claim 1, wherein the orchestration layer is configured to execute multiple models in parallel.

4. The method according to claim 1, wherein the probe is configured to generate an ensemble output during the execution of the model.

5. The method according to claim 1, further comprising:
    injecting, by the model control platform circuitry, the probe into the container.

6. The method according to claim 1, wherein:
    the input data comes from a live deployment and is used to create an early warning system for the live deployment; and
    the orchestration layer of the model control platform stack is configured to deploy the model from a staging environment to a production environment.

7. A system comprising:
    a non-transitory memory storing instructions for a model control platform stack; and
    a processor in communication with the non-transitory memory, wherein, the processor executes the instructions to cause the system to:
        at an input layer of the model control platform stack:
            receive input data;
        at a governance layer of the model control platform stack:
            maintain a probe inventory;
            maintain a model inventory;
            select, based on a type of the input data, a model from the model inventory;
            select, based on the model, a monitoring location point;
            select, based on the monitoring location point, a probe from the probe inventory;
            deploy, based on the selections of the probe and the model, a container to an orchestration layer of the model control platform stack;
        at the orchestration layer of the model control platform stack:
            access the container;
            use the container to deploy the probe and the model;
            after deployment of the probe and the model, schedule an execution of the model to predict an inference based on the input data, the inference comprises a predicted result;
            during the execution, extract, via the probe, probe data from the monitoring location point;
            adjust a hyperparameter of the model based on a difference between actual result in the probe data and the predicted result;
            re-train the model based on the adjusted hyperparameter,
        wherein the monitoring location point comprises a memory location for an operating system on which the orchestration layer executes.

8. The system according to claim 7, wherein the governance layer of the model control platform stack is configured to:
    deploy multiple probes to the orchestration layer; or
    deploy multiple models to the orchestration layer.

9. The system according to claim 7, wherein the orchestration layer is configured to execute multiple models in parallel.

10. The system according to claim 7, wherein the probe is configured to generate an ensemble output during the execution of the model.

11. The system according to claim 7, further comprising instructions executed by the processor to cause the system to:
inject the probe into the container.

12. The system according to claim 7, wherein:
the input data comes from a live deployment and is used to create an early warning system for the live deployment; and
the orchestration layer is configured to deploy the model from a staging environment to a production environment.

13. A system comprising:
machine-readable media other than a transitory signal;
instructions stored on the machine-readable media for a model control platform stack; and
wherein the instructions are executable by a processor to: at an input layer of the model control platform stack:
receive input data;
at a governance layer of the model control platform stack:
maintain a probe inventory;
maintain a model inventory;
select, based on a type of the input data, a model from the model inventory;
select, based on the model, a monitoring location point;
select, based on the monitoring location point, a probe from the probe inventory;
deploy, based on the selections of the probe and the model, a container to an orchestration layer of the model control platform stack;
at the orchestration layer of the model control platform stack:
access the container;
use the container to deploy the probe and the model;
after deployment of the probe and the model, schedule an execution of the model to predict an inference based on the input data, the inference comprises a predicted result;
during the execution, extract, using the probe, probe data from the monitoring location point;
adjust a hyperparameter of the model based on a difference between actual result in the probe data and the predicted result;
re-train the model based on the adjusted hyperparameter,
wherein the monitoring location point comprises a memory location for an operating system on which the orchestration layer executes.

14. The system according to claim 13, wherein the governance layer of the model control platform stack is configured to:
deploy multiple probes to the orchestration layer; or
deploy multiple models to the orchestration layer.

15. The system according to claim 13, wherein the orchestration layer is configured to execute multiple models in parallel.

16. The system according to claim 13, wherein the probe is configured to generate an ensemble output during the execution of the model.

17. The system according to claim 13, wherein when the processor executes the instructions, the system is further configured to:
inject the probe into the container; and
deploy the model from a staging environment to a production environment.

* * * * *